US012604682B2

(12) United States Patent
Abel et al.

(10) Patent No.: US 12,604,682 B2
(45) Date of Patent: Apr. 14, 2026

(54) METHODS FOR PATTERNING A SEMICONDUCTOR SUBSTRATE USING METALATE SALT IONIC LIQUID CRYSTALS

(71) Applicant: Tokyo Electron Limited, Tokyo (JP)

(72) Inventors: Kate Abel, Austin, TX (US); Dipak Aryal, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 376 days.

(21) Appl. No.: 18/388,222

(22) Filed: Nov. 9, 2023

(65) Prior Publication Data

US 2025/0157810 A1 May 15, 2025

(51) Int. Cl.
| | |
|---|---|
| *H01L 21/02* | (2006.01) |
| *H01L 21/027* | (2006.01) |
| *H10P 14/60* | (2026.01) |
| *H10P 14/692* | (2026.01) |
| *H10P 76/20* | (2026.01) |
| *H10P 76/40* | (2026.01) |

(52) U.S. Cl.
CPC ...... *H10P 14/6314* (2026.01); *H10P 14/6319* (2026.01); *H10P 14/6938* (2026.01); *H10P 76/20* (2026.01); *H10P 76/2041* (2026.01); *H10P 76/405* (2026.01); *H10P 76/4085* (2026.01); *H10P 76/4088* (2026.01)

(58) Field of Classification Search
CPC ............. H01L 21/0274; H01L 21/0332; H01L 21/0337; C09K 19/04
See application file for complete search history.

(56) References Cited

U.S. PATENT DOCUMENTS

| | | | |
|---|---|---|---|
| 8,048,795 B2 | 11/2011 | Lee et al. | |
| 8,669,645 B2 | 3/2014 | Millward et al. | |
| 8,900,963 B2 | 12/2014 | Sills et al. | |
| 12,398,324 B1 * | 8/2025 | Aryal ..................... | C07F 5/003 |
| 12,444,606 B2 * | 10/2025 | Aryal ................. | H01L 21/0335 |

(Continued)

FOREIGN PATENT DOCUMENTS

| | | |
|---|---|---|
| JP | 2023129266 | 9/2023 |
| WO | 2021133840 | 7/2021 |

OTHER PUBLICATIONS

International Searching Authority, Written Opinion of the International Searching Authority, International application No. PCT/US2024/043718, Dec. 2, 2024, all pages. (Year: 2024).*

(Continued)

*Primary Examiner* — Victoria K. Hall
(74) *Attorney, Agent, or Firm* — Egan, Enders & Huston LLP.

(57) ABSTRACT

Embodiments of improved process flows and methods are provided to pattern a semiconductor substrate using direct self-assembly (DSA) of metalate salt ionic liquid crystals (ILCs) having metalate anions. After self-assembly of the metalate salt ILCs into ordered structures, an oxidation process is used to remove the organic components of the ordered structures and convert the metalate anions into metal oxide patterns. In addition to providing a robust metal oxide pattern, which can be transferred to the underlying substrate, the process flows and methods disclosed herein enable ILCs to be used as pitch multipliers in advanced patterning techniques.

21 Claims, 6 Drawing Sheets

(56)  References Cited

U.S. PATENT DOCUMENTS

| 2016/0244581 A1 | 8/2016 | Brink et al. |
| 2017/0162380 A1 | 6/2017 | Cheng et al. |

OTHER PUBLICATIONS

International Searching Authority, International Search Report, International application No. PCT/US2024/043718, Dec. 2, 2024, all pages. (Year: 2024).*

Nickmans et al., "Directed Self-Assembly Of Liquid-Crystalline Molecular Building Blocks For Sub-5 nm Nanopatterning", Advanced Materials, Progress Report, Adv. Mater. 2018, 16 pgs.

Hayashi et al., "Discovery Of A Magnetic Ionic Liquid [bmim]FeCi4", Chemistry Letters vol. 33, No. 12, 2004, 2 pgs.

Fernandez et al., "Key Developments In Ionic Liquid Crystals, International Journal Of Molecular Sciences", 2016, 31 pgs.

Pinto-Gomez et al., "Directed Self-Assembly Of Block Copolymers For The Fabrication Of Functional Devices", MDPI, 2020, 21 pgs.

Zhong et al., "Syntheses, Structures, And Properties of A Series Of Metal Ion-Containing Dialkylimidazolium Ionic Liquids", The Chemical Society of Japan, 2007, 11 pgs.

Konwar et al., "Transition Metal Containing Ionic Liquid-Assisted One-Pot Synthesis Of Pyrazoles At Room Temperature", J. Chem. Sci., 2019, 9 pgs.

Ding et al., "Transition Metal-Containing Ionic Liquid Crystals With 1-Decyl-2, 3-Dimethylimidazolium; Facile Syntheses, Crystal Structures, Thermal Properties And NH3 Detection", Wiley-VCH, Chemistry-Europe On Line Library, 2018, 7 pgs.

Kapernaum et al., "Current Topics In Ionic Liquid Crystals", Chemistry Europe, ChemPlusChem, 2022, 38 pgs.

Saielli, "Comparison Of The Ionic Liquid Crystal Phase Of [C12C1im] [BF4] and [C12c1im]C1 By Atomistic MD Simulations", Crystals, MDPI, Mar. 2020, 10 pgs.

Renier et al., "Developing Design Tools For Introducing And Tuning Structural Order In Ionic Liquids, Royal Society Of Chemistry", CrystEngComm, 2021, 11 pgs.

Pulukkody et al., "Mesomorphism Of Imidazolium-Based Fluorinated Ionic Liquids, Journal Of Ionic Liquids", 2024, 8 pgs.

Wang et al., "Regulating The Mesogenic Properties Of Imidazolium Salts By Modifying N3-Substituents", Science China Chemistry, vol. 58, No. 12, 2015, 7 pgs.

Kloos et al., "Self-Assembling Liquid Crystals As Building Blocks To Design Nanoporous Membranes Suitable For Molecular Separations", Journal Of Membrane Science, 2021, 18 pgs.

International Search Report and The Written Opinion; PCT/US2024/043718; Dec. 3, 2024; 9 pgs.

Ruan et al., "Ionic Liquid Crystal Electrolytes: Fundamental, Applications and Prospects", Nano Energy, vol. 106, Feb. 2023, 9 pgs.

* cited by examiner

100

Organic
Anion

Cation
Head Group

Alkyl
Tail Group

METHODS FOR PATTERNING A SEMICONDUCTOR SUBSTRATE USING METALATE SALT IONIC LIQUID CRYSTALS

RELATED APPLICATION DATA

This application is related to U.S. patent application Ser. No. 18/388,240, filed Nov. 9, 2023 (the same date as this application), is entitled "Methods for Forming Vertically Layered Ionic Liquid Crystal (ILC) Structures on a Semiconductor Substrate;" the disclosure of which is expressly incorporated herein, in its entirety, by reference.

TECHNICAL FIELD

The present disclosure relates to the processing of semiconductor substrates. In particular, it provides improved methods and processes for patterning semiconductor substrates using direct self-assembly (DSA) of ionic liquid crystals (ILCs).

BACKGROUND

Semiconductor devices, such as integrated circuits (ICs), are fabricated by sequentially depositing and patterning layers of dielectric, conductive, and semiconductor materials over a semiconductor substrate to form a network of electronic components and interconnect elements (e.g., transistors, resistors, capacitors, metal lines, contacts, and vias), which are integrated in a monolithic structure. At each successive technology node, the minimum feature sizes are shrunk to reduce cost by roughly doubling the component packing density.

A common patterning method is to use a photolithography process, which includes photoresist coating, exposure and develop steps, to form a desired pattern on a substrate surface that can be transferred to an underlying layer. In conventional photolithography processes, a substrate surface is coated with a light-sensitive photoresist film and exposed to light to convert exposed portions of the light-sensitive photoresist film to a reacted photoresist. After exposure, a developing step is performed to remove the reacted (or unreacted) portion of the photoresist film for patterning, thus providing a photoresist pattern on the substrate.

In this technique, the resolution of the optical system used to perform the lithography step limits the minimum feature size that can be patterned with acceptable control and the minimum pitch between the features in the pattern. According to the Rayleigh criterion, the minimum feature size is proportional to the wavelength ($\lambda$) of light used for imaging, and inversely proportional to the numerical aperture (NA) of the projection lens. Over time, shorter wavelengths of light—from visible wavelengths (436 nm) to UV (365 nm), deep-UV (248 and 193 nm) and extreme-UV (EUV, 13.5 nm) wavelengths—have been utilized to reduce the feature size and pitch obtainable for advanced technology nodes. Today, EUV lithography is commonly used at the industry level for advanced patterning at 10 nm, 7 nm and 5 nm technology nodes.

As feature sizes continue to scale below 5 nm, it becomes desirable to produce patterns with critical dimensions (CDs) smaller than the wavelengths of light widely available for industrial applications. This requires new pattern-transfer methods, since the resolution of the optical system remains limited by the wavelength ($\lambda$) of light used for imaging. One method for achieving suitable photolithography for increasingly smaller CDs is to use a multi-patterning technique for pitch splitting or pitch multiplication. Examples of multi-patterning techniques include self-aligned double patterning (SADP), self-aligned triple patterning (SATP) and self-aligned quadruple patterning (SAQP). These multi-patterning techniques involve the utilization of sidewall spacers, fill layers and selective etching for defining structures at pitches, which are less than the original photolithography pitch.

Direct self-assembly (DSA) of polymers and other small molecules has recently been investigated as another pitch multiplier for pattern transfer technology. In these methods, large templates are patterned to direct the molecular self-assembly of polymers or other small molecules, which self-assemble within the larger template to produce patterns having substantially smaller pitch. The self-assembled patterns are then used as the template for pattern transfer.

DSA of block copolymers (BCPs) has been widely investigated as a pitch multiplier for pattern-transfer technology, due to its high resolution, low cost and ease of integration and scalability. BCPs are macromolecules consisting of covalently bonded homogeneous blocks (or chains) of chemically different monomers. Due to the dis-affinity and repulsion forces between these blocks, BCPs phase segregate into microdomains to generate self-assembled patterns within the nano/microscale domain. After self-assembly, one of the blocks is removed and the remaining polymer is used as mask to pattern the underlying substrate.

Although DSA of block copolymers has received much attention, there are several issues preventing their integration into the semiconductor patterning process. First, since the characteristic dimensions of BCPs are controlled by the molecular weight of the polymer, the minimum pitch that can be achieved through BCP self-assembly is currently limited to 10 nm. Thus, DSA of block copolymers cannot be used as a pitch multiplier for pattern transfer at sub-10 nm feature sizes. Second, BCPs are soft organic building blocks that have a tendency to form arbitrarily oriented poly-domain structures when left unguided. This prevents their use in pattern transfer technology.

Ionic liquid crystals (ILCs) have recently been proposed as another class of materials for molecular self-assembly. Ionic liquid crystals are salts having properties of ionic liquids (ILs) and liquid crystals (LCs). FIG. 1A shows a mapping of coarse grain (CG) particles within an example ILC molecule 100. As shown in FIG. 1A, the ILC molecule 100 (e.g., 1-dodecyl-3-methylimidazolium tetrafluoroborate) contains a cation head group (e.g., an imidazolium-based cation) covalently bound to an elongated alkyl tail group and an anion (e.g., tetrafluoroborate, $BF_4^-$). Due to the difference in polarity between the ionic groups, ILCs spontaneously segregate into ordered phases (otherwise referred to as ordered structures) at or near room temperature.

FIG. 1B shows one example of an ordered structure formed by direct self-assembly of the ILC molecules shown in FIG. 1A. One dominant phase of the self-assembled ILC is a lamellar structure 110 of alternating distinct layers. As shown in FIG. 1B, the lamellar structure 110 includes a first distinct layer 120 (approximately 1 nm wide) containing the cation head groups and anions of the ILCs, and a second distinct layer 130 (approximately 2 nm wide) containing the interdigitated alkyl tail groups of the ILCs. The layer pitch ($\rho$) between the alternating layers of the lamellar structure 110 is equal to the combined width (approximately 3 nm) of the head and tail groups of the self-assembled ILCs. Although other phases may be formed, the lamellar structure 110 shown in FIG. 1B (otherwise referred to herein as a layered structure) may be particularly useful in the patterning of features on a substrate at sub-5 nm pitch.

Similar to block copolymers, ILCs self-assemble into ordered structures, albeit at a much smaller scale. The ordered structures produced by self-assembled ILCs can be used for pitch multiplication in pattern transfer methods, as long as the self-assembly pattern can be transferred to the underlying substrate. However, the use of ILCs in pattern transfer technology remains challenging. The first challenge is to produce vertically layered patterns of ILCs on the substrate surface. The second challenge is to transfer the vertically layered patterns to the underlying substrate. New methods and processes are needed to overcome these challenges.

SUMMARY

The present disclosure provides various embodiments of improved methods and processes for patterning a semiconductor substrate using direct self-assembly (DSA) of ionic liquid crystals (ILC). In particular, the disclosed embodiments utilize DSA of metalate salt ILCs having a cation head group, an alkyl tail group and a metalate anion. When metalate salt ILCs self-assemble, the difference in polarity between the cation head groups and the alkyl tail groups cause the head and tail groups to segregate into ordered structures with the metalate anions segregated to the head group layers. Oxidation of the ordered structures: (a) converts the organic material within the alkyl tail group layers into volatile carbon oxides, which are removed from the substrate surface during the oxidation process, and (b) converts the metalate anions within the head group layers into non-volatile metal oxides, which are left on the substrate surface after oxidation. In doing so, the oxidation process volatizes the ionic liquid crystal layer, but leaves behind a metal oxide pattern where the metalate anions were concentrated. The metal oxide pattern is more robust than the ionic liquid crystal layer, and thus, can be used as a hard mask in subsequent processing steps.

In addition to providing a robust metal oxide pattern that can be transferred to the underlying substrate, the improved methods and processes disclosed herein enable ionic liquid crystals to be used as pitch multipliers in advanced patterning techniques. By utilizing the techniques described above, the improved methods and processes disclosed herein can be used to form metal oxide patterns at sub-5 nm pitch (e.g., 3 nm), which is much smaller than the pitch currently possible with EUV lithography or block copolymer DSA.

According to one embodiment, a method is provided herein to pattern a semiconductor substrate. The method may generally include producing a first pattern on an underlying layer of the semiconductor substrate, where the first pattern includes a plurality of features formed at a first pitch, and depositing an ionic liquid crystal (ILC) solution within each of the plurality of features. The ILC solution includes metalate salt ionic liquid crystals (ILCs) having a cation head group, an alkyl tail group and a metalate anion. The metalate salt ILCs deposited within the plurality of features self-assemble into layered structures having alternating layers of head group layers and tail group layers, with the metalate anions segregated to the head group layers. After self-assembly, the method may expose the semiconductor substrate to an oxidization process to remove the tail group layers from the layered structures and convert the head group layers of the layered structures into a metal oxide pattern having a second pitch, which is smaller than the first pitch. The method may further include transferring the metal oxide pattern to the underlying layer of the semiconductor substrate.

In some embodiments, the method may expose the semiconductor substrate to the oxidization process by exposing the semiconductor substrate to an oxygen plasma ashing process, an ultra-violet (UV) ozone process, a gas phase oxidation process or a solution phase oxidation process. Regardless of the oxidation process used, exposing the semiconductor substrate to the oxidization process may oxidize the layered structures to: (a) convert the tail group layers into volatile carbon oxides, which are removed from the layered structures during the oxidation process; and (b) convert the metalate anions within the head group layers into non-volatile metal oxides, which remain after the oxidation process. The non-volatile metal oxides created via oxidation of the metalate anions form the metal oxide pattern, which is transferred to the underlying layer of the semiconductor substrate.

The ILC solution deposited within the features may include a wide variety of metalate salt ILCs having various cation head groups, alkyl tail groups and metalate anions. In some embodiments, the metalate salt ILCs included within the ILC solution may include an imidazolium, pyrazolium, pyrrolidinium, pyridinium, piperidinium, morpholinium, ammonium, phosphonium, sulphonium or cholinium based cation head group. In some embodiments, the metalate salt ILCs may include an imidazolium-based cation head group of the form: $1\text{-}R_1\text{-}3\text{-}R_2\text{-}$imidazolium, where $R_1$ is an alkyl chain with a chain length ranging from 8-18 carbons, and $R_2$ is a hydrogen, methyl, ethyl, propyl, butyl, substituted or unsubstituted phenyl, or other hydrocarbon group. In example embodiments, the metalate salt ILCs may be comprised of 1-dodecyl-3-methylimidazolium cations and metalate anions. A wide variety of metalate anions may be used including chloroaluminate anions, chloroferrate anions, chlorostannate anions, chloroindate anions or chlorozincate anions. In one example embodiment, the metalate salt ILCs may be 1-dodecyl-3-methylimidazolium tetrachloroaluminate. In another example embodiment, the metalate salt ILCs may be 1-dodecyl-3-methylimidazolium tetrachloroferrate.

In some embodiments, the method may produce the first pattern on the underlying layer of the semiconductor substrate by: (a) depositing a neutral layer on the underlying layer of the semiconductor substrate; (b) depositing a hydrophilic layer on the neutral layer; and (c) using a photolithography process to produce the first pattern within the hydrophilic layer, such that the neutral layer is exposed at a bottom of each feature and the hydrophilic layer is exposed on sidewall surfaces of each feature. In some embodiments, the photolithography process may form a plurality of trenches within the hydrophilic layer to form a pattern of hydrophilic lines on the neutral layer, and the ILC solution may be deposited within the plurality of trenches. In other embodiments, the photolithography process may form a pattern of holes that extend through the hydrophilic layer to the neutral layer, and the ILC solution may be deposited within each of the holes formed within the hydrophilic layer.

In some embodiments, the metalate salt ILCs deposited within the plurality of features may self-assemble into vertically layered structures having alternating layers of head group layers and tail group layers, wherein the head group layers of the vertically layered structures are oriented towards the sidewall surfaces of the features. The layer pitch between the alternating layers of the vertically layered structures is equivalent to the combined width of the head and tail groups of the self-assembled ILCs and is generally dependent on the chain length of the alkyl tail groups. In some embodiments, the width of each feature may be equivalent to an integer multiple of the layer pitch between the alternating layers of the vertically layered structures. Doing so enables the metalate salt ILCs to orient themselves and self-assemble into vertically layered structures within the features.

In some embodiments, the method may further include controlling a layer pitch between the alternating layers of the vertically layered structures by controlling a chain length of the alkyl tail groups. For example, the method may utilize a metalate salt ILC with a longer alkyl chain length to increase the layer pitch, or a metalate salt ILC with a smaller alkyl chain length to decrease the layer pitch. By selecting a metalate salt ILC that self-assembles into a vertically layered structure having a layer pitch, which is smaller than the first pitch between the plurality of features, and oxidizing the vertically layered structure to produce a metal oxide pattern having a second pitch, which is equivalent to the layer pitch, the method disclosed herein can be used to provide pitch multiplication for advanced patterning techniques.

According to another embodiment, a pitch multiplication method is provided herein, the pitch multiplication method may generally include: (a) producing a first pattern on a semiconductor substrate, the first pattern comprising a plurality of features formed at a first pitch; and (b) producing a second pattern within each of the plurality of features using direct self-assembly (DSA) of metalate salt ionic liquid crystals (ILCs) followed by oxidation to convert metalate anions included within the metalate salt ILCs into metal oxides. The second pattern comprising the metal oxides may be formed at a second pitch, which is less than the first pitch.

In some embodiments, the method may produce the second pattern by: (a) depositing an ionic liquid crystal (ILC) solution comprising the metalate salt ILCs within each of the plurality of features, wherein the metalate salt ILCs comprise cation head groups, alkyl tail groups and the metalate anions, and wherein the metalate salt ILCs deposited within the plurality of features self-assemble into layered structures having alternating layers of head group layers and tail group layers, with the metalate anions segregated to the head group layers; and (b) exposing the semiconductor substrate to an oxidization process to remove the tail group layers from the layered structures and convert the metalate anions into the metal oxides.

In some embodiments, the method may produce the first pattern by: (a) depositing a neutral layer on the semiconductor substrate, (b) depositing a hydrophilic layer on the neutral layer, and (c) using a photolithography process to produce the first pattern within the hydrophilic layer, such that the neutral layer is exposed at a bottom of each feature and the hydrophilic layer is exposed on sidewall surfaces of each feature. When the metalate salt ILCs are deposited within the plurality of features, the metalate salt ILCs may self-assemble into vertically layered structures having alternating layers of head group layers and tail group layers, with the head group layers oriented towards the sidewall surfaces of the features.

Exposing the semiconductor substrate to the oxidization process removes the tail group layers from the vertically layered structures and converts the metalate anions into the metal oxides. A wide variety of oxidation processes can be used in the method. For example, the semiconductor substrate may be exposed to an oxygen plasma ashing process, an ultra-violet (UV) ozone process, a gas phase oxidation process or a solution phase oxidation process. Regardless of the oxidation process used, the vertically layered structures formed within the plurality of features are oxidized to: (a) convert the tail group layers into volatile carbon oxides, which are removed from the vertically layered structures during the oxidation process, and (b) convert the metalate anions within the head group layers into non-volatile metal oxides, which remain on the substrate after the oxidation process.

In some embodiments, the method may further include controlling a layer pitch between the alternating layers of the vertically layered structures by controlling a chain length of the alkyl tail groups included within the metalate salt ILCs. In some embodiments, a width of each feature may be equivalent to an integer multiple of the layer pitch between the alternating layers of the vertically layered structures, and the second pitch (between the metal oxides of the second pattern) may be equivalent to the layer pitch.

As noted above and described further herein, the present disclosure provides various embodiments of methods for patterning a semiconductor substrate using direct self-assembly (DSA) of metalate salt ILCs. Of course, the order of discussion of the different steps as described herein has been presented for the sake of clarity. In general, these steps can be performed in any suitable order. Additionally, although each of the different features, techniques, configurations, etc., herein may be discussed in different places of this disclosure, it is intended that each of the concepts can be executed independently of each other or in combination with each other. Accordingly, the present invention can be embodied and viewed in many different ways.

Note that this Summary section does not specify every embodiment and/or incrementally novel aspect of the present disclosure or claimed inventions. Instead, the summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 5 is a block diagram illustrating an example process flow that uses the method shown in FIG. 4 to pattern a semiconductor substrate.

DETAILED DESCRIPTION

The present disclosure provides various embodiments of improved methods and processes for patterning a semiconductor substrate using direct self-assembly (DSA) of ionic liquid crystals (ILCs). In particular, the disclosed embodiments utilize DSA of metalate salt ILCs having a cation head group, an alkyl tail group and a metalate anion. When metalate salt ILCs self-assemble, the difference in polarity between the cation head groups and the alkyl tail groups cause the head and tail groups to segregate into ordered structures with the metalate anions segregated to the head group layers. Oxidation of the ordered structures: (a) converts the organic material within the alkyl tail group layers into volatile carbon oxides, which are removed from the substrate surface during the oxidation process, and (b) converts the metalate anions within the head group layers into non-volatile metal oxides, which are left on the substrate surface after oxidation. In doing so, the oxidation process volatizes the ionic liquid crystal layer, but leaves behind a metal oxide pattern where the metalate anions were concentrated. The metal oxide pattern is more robust than the ionic liquid crystal layer, and thus, can be used as a hard mask in subsequent processing steps.

In addition to providing a robust metal oxide pattern that can be transferred to the underlying substrate, the improved methods and processes disclosed herein enable ionic liquid crystals to be used as pitch multipliers in advanced patterning techniques. By utilizing the techniques described above, the improved methods and processes disclosed herein can be used to form metal oxide patterns at sub-5 nm pitch (e.g., 3 nm), which is much smaller than the pitch currently possible with EUV lithography or block copolymer DSA.

Similar to block copolymers, the ordered structures of ionic liquid crystals can be controlled by the chain length of the alkyl tails, balance of electrostatic and van der Waals interactions, temperatures and interactions with substrate. For example, the periodicity between the ordered structures, or pitch, can be controlled by modulating the chain length of the alkyl tails. The orientation of the ordered structures is also highly influenced by the hydrophobicity of the guide surfaces, such as the underlying substrate surface and/or the sidewalls of the larger template pattern.

Figure 2:
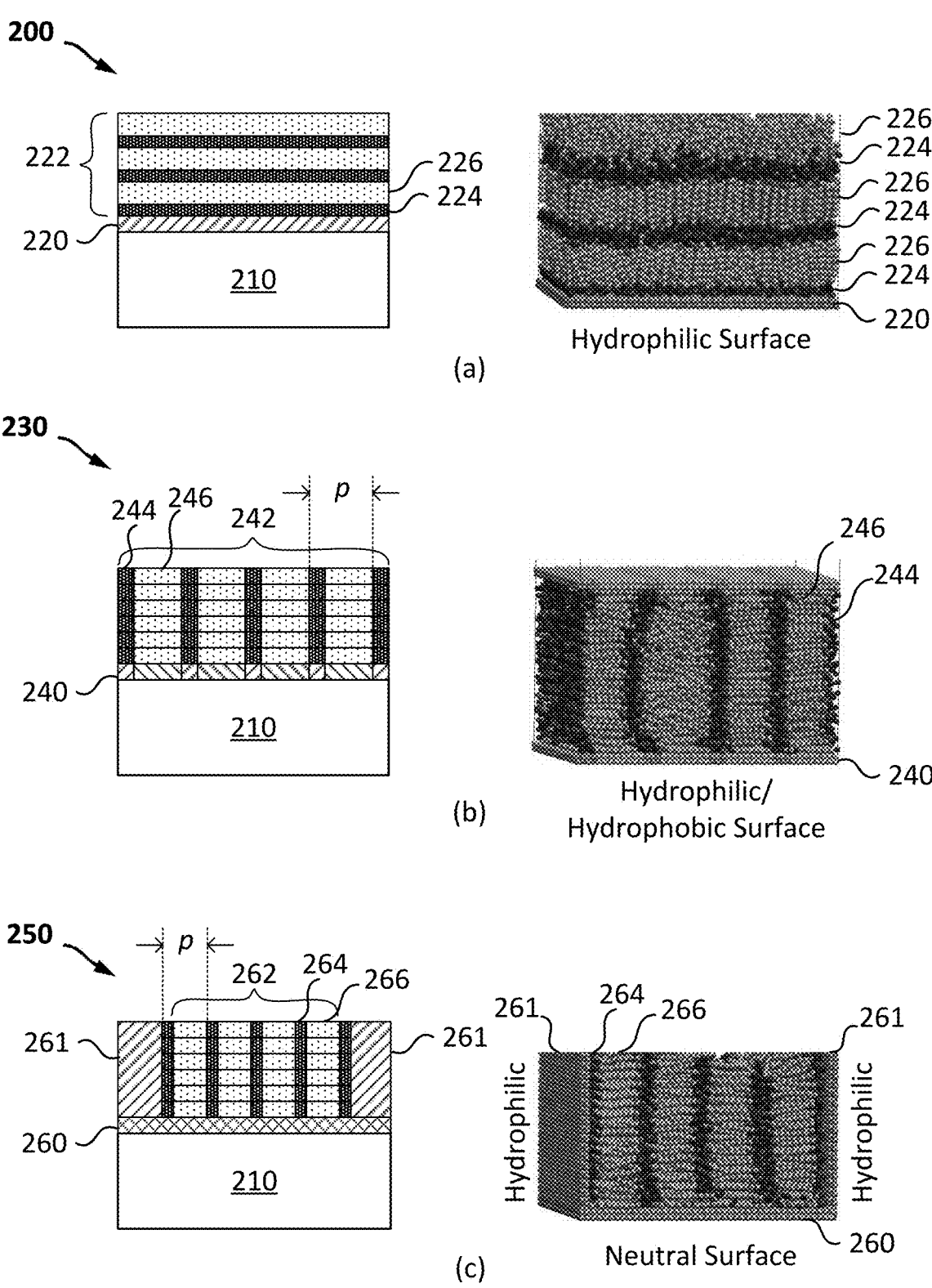
FIGS. 2(a)-(c) provide course-grain simulations showing that DSA of ILCs can be controlled by modulating the hydrophobicity of guide surfaces.

FIGS. 2(*a*)-(*c*) show coarse-grained (CG) simulation results of various lamellar structures formed by the direct self-assembly (DSA) of an example ILC (e.g., 1-dodecyl-3-methylimidazolium tetrafluoroborate). In the embodiment 200 shown in FIG. 2(*a*), a substrate 210 is provided with a hydrophilic surface layer 220. As shown in FIG. 2(*a*), self-assembly of the ILC on the hydrophilic surface layer 220 results in a horizontally layered structure 222 containing alternating horizontal layers of cation head groups 224 and interdigitated alkyl tail groups 226.

Vertically layered structures can be formed by assembling ILCs on other substrate surfaces, as shown in FIGS. 2(*b*) and 2(*c*). In the embodiment 230 shown in FIG. 2(*b*), the substrate 210 is provided with a periodic surface 240 comprising alternating hydrophilic and hydrophobic surface layers. As shown in FIG. 2(*b*), self-assembly of the ILC on the periodic surface 240 results in a vertically layered structure 242 containing alternating vertical layers of cation head groups 244 and interdigitated alkyl tail groups 246. In the embodiment 250 shown in FIG. 2(*c*), a feature formed on the substrate 210 is provided with a neutral bottom surface 260 and hydrophilic sidewalls 261. As shown in FIG. 2(*c*), self-assembly of the ILC within the feature results in a vertically layered structure 262 containing alternating vertical layers of cation head groups 264 and interdigitated alkyl tail groups 266.

As shown in FIGS. 2(*a*)-(*c*), the difference in polarity between the cation head groups 224/244/264 and alkyl tail groups 226/246/266 promote self-assembly of the ILC molecules and segregate the head and tail groups into lamellar structures, including both horizontal (FIG. 2(*a*)) and vertical (FIGS. 2(*b*)-(*c*)) orientations. As shown in FIGS. 2(*b*) and 2(*c*), the layer pitch ($\rho$) between the alternating layers of the vertically oriented lamellar structures is equal to the combined width of the head and tail groups of the self-assembled ILC molecules. Since the layer pitch ($\rho$) is much smaller than what is currently achievable with photolithography, the vertically layered structures shown in FIGS. 2(*b*) and 2(*c*) can be used as patterns for pitch multiplication, as long as the patterns can be successfully transferred to the underlying substrate 210. However, there are challenges involved in both forming the vertically layered patterns of ILCs and transferring the vertically layered patterns to the underlying substrate.

Figure 3:
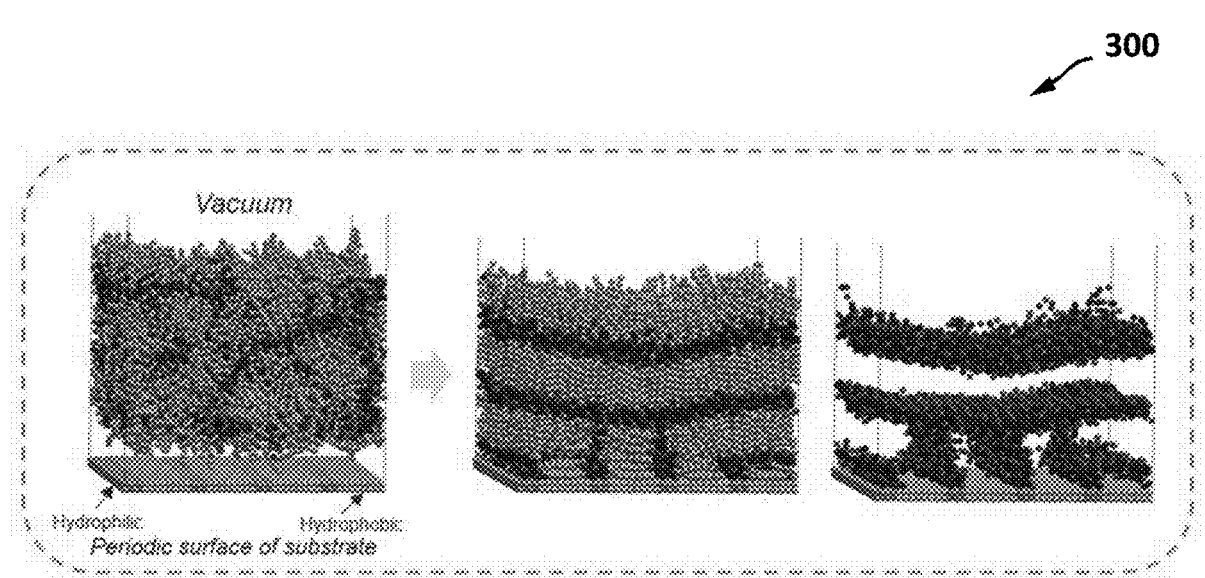
FIG. 3 is a course-grain simulation showing challenges faced when attempting to form vertically layered ILC structures on a periodic substrate surface in vacuum.

One method to form vertical layered patterns of ILCs involves deposing an ILC solution on a periodic substrate surface, as shown for example in FIG. 2(*b*), while exposing an upper surface of ILC solution to vacuum. A course-grain simulation 300 is shown in FIG. 3 to illustrate the challenges faced when attempting to form vertically layered ILC structures on a periodic substrate surface in vacuum. As shown in FIG. 3, vertical patterns cannot propagate from the bottom to the top of an ILC film formed in vacuum due to the hydrophobic nature of the vacuum, which attracts the alkyl tail groups of the ILCs, causing them to face up at the interface. This leads to defective/distorted patterns of self-assembled ILCs on the substrate surface.

Co-pending U.S. patent application Ser. No. 18/388,240, which is entitled "Methods for Forming Vertically Layered Ionic Liquid Crystal (ILC) Structures on a Semiconductor Substrate," filed Nov. 9, 2023 and incorporated herein in its entirety, overcomes the challenges faced when forming vertically layered ILC structures on a periodic substrate surface by depositing the ILC solution in the presence of a gas phase, non-polar solvent. Since non-polar solvents are not attracted to the polar molecules (e.g., the cation head groups and anions) of the ILCs, exposing the ILC solution to a gas phase, non-polar solvent allows the ILC molecules to orient themselves into a vertically layered structure on the periodic substrate surface. Another method to form vertical layered patterns of ILCs involves providing an ILC film within a feature having a neutral bottom surface and hydrophilic sidewalls, as shown in FIG. 2(*c*). By attracting the polar molecules of the ILCs, the hydrophilic sidewall surfaces enable the ILC molecules to orient themselves into a vertically layered lamellar structure within the feature.

After a vertically layered pattern of self-assembled ILCs is formed on the substrate surface, additional challenges must be overcome to successfully transfer the vertically layered pattern to the underlying surface. For example, removing the alkyl tail groups from the ILC film leaves an ionic liquid on the substrate surface. On the other hand, removing the cation head group from the ILC film leaves the alkyl tail groups, which are also liquid at room temperature.

The remaining group (e.g., the organic anion) within the ILC film is mobile in both of these options, so no patterning information will be maintained if one or more groups of the self-assembled ILCs are removed. To overcome these challenges, the present disclosure provides new methods of transferring the patterning information of self-assembled ILCs to the underlying substrate.

Figure 1A:
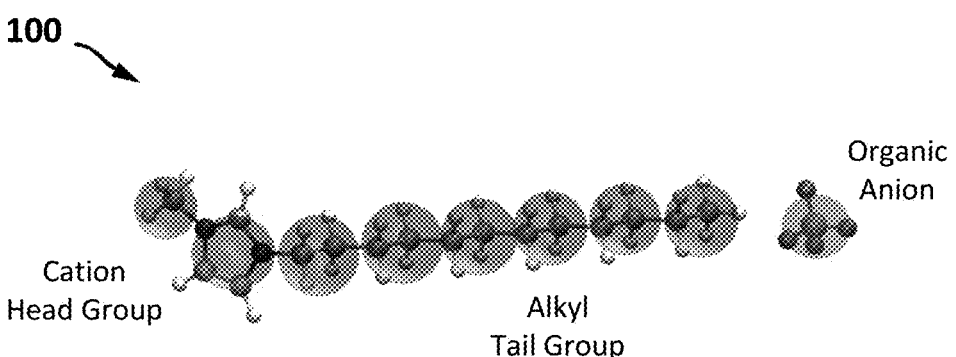
FIG. 1A is a mapping of coarse grain (CG) particles of an example ionic liquid crystal (ILC).
Figure 1B:
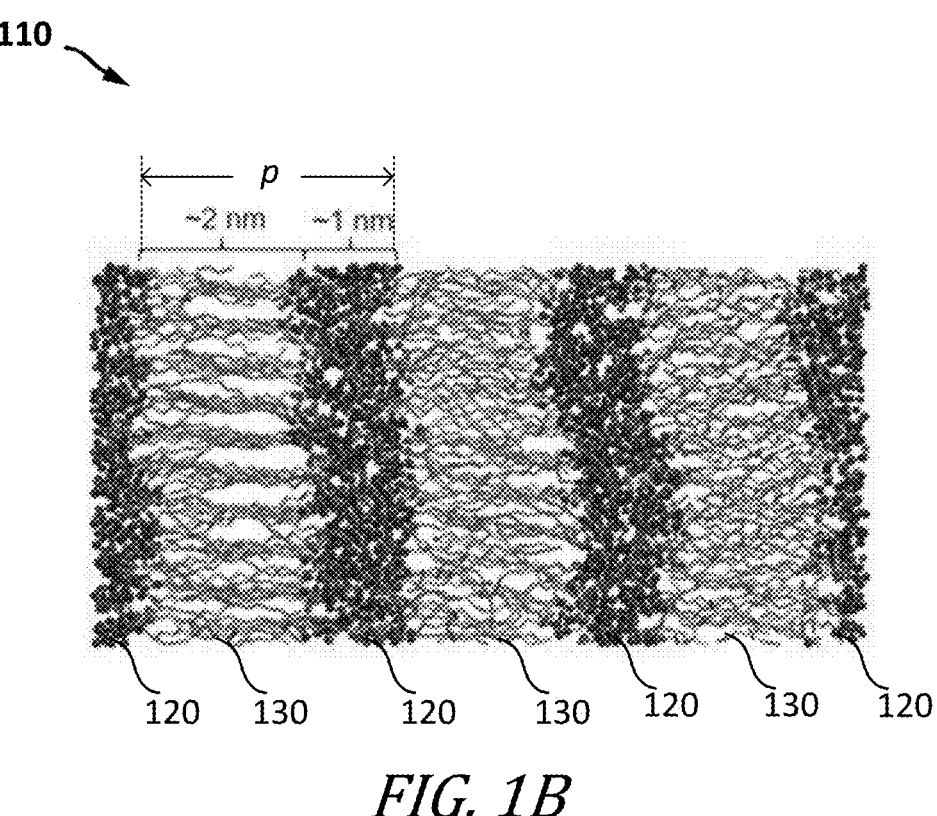
FIG. 1B illustrates one example of an ordered structure formed by direct self-assembly (DSA) of an ILC at room temperature.

As shown in FIG. 1A, ionic liquid crystals (ILCs) are typically composed of an imidazolium-based cation with a long-chain hydrocarbon as the alkyl tail group and an anion, such as tetrafluoroborate. However, other ILCs can be formed having other cations and/or anions. For example, ILCs can be formed having imidazolium, pyrazolium, pyrrolidinium, pyridinium, piperidinium, morpholinium, ammonium, phosphonium, sulphonium or cholinium based cation head groups. Anions commonly used to form ILCs include tetrafluoroborate ($BF_4^-$), chloride ($Cl^-$), acetate ($CH_3COO^-$), hexafluorophosphate ($PF_6^-$), trifluoromethyl acetate ($C_3H_3F_3O_2^-$), nitrate ($NO_3^-$), dicyanamide ($C_2HN_3^-$), tetracyano borate ($B(CN)_4^-$), trifluoromethane sulfonate ($CF_3O_3S^-$) and bis((trifluoromethyl)sulfonyl)imdide ($[(CF_3SO_2)_2N]^-$).

In the present disclosure, the anions commonly used to form ILCs are replaced with metalate anions to form metalate salt ILCs. In addition to preserving the self-assembly properties of the ILCs, the metalate anion enables a new method of pattern transfer after the metalate salt ILCs self-assemble into a desired layered structure (e.g., a vertically oriented or horizontally oriented lamellar structure).

As known in the art, a metalate anion (or "metalate") is a complex anion containing a metal ligated to several atoms or small groups. A metalate anion can include any metal and a wide variety of ligands. Examples of metals that may be included within a metalate anion include transition metals (such as, e.g., iron (Fe), copper (Cu), cobalt (Co), Zinc (Zn), Cadmium (Cd), etc.), post-transition metals (such as, e.g., aluminum (Al), indium (In), tin (Sn), lead (Pb), bismuth (Bi), etc.) and lanthanides (such as, e.g., cerium (Ce), neodymium (Nd), samarium (Sm), etc.). Examples of ligands that may be included within a metalate anion include oxo, halo, cyano (CN), thiocyano (SCN), nitrato, sulfato, phosphato, phosphine, trifluoromethane sulfonate, sulfo and carbonato ligands.

In some embodiments, the metalate anion may be a chlorometalate anion. Examples of chlorometalate anions that may be used to form the metalate salt ILCs described herein include, but are not limited to, chloroaluminate anions (such as, e.g., $[AlCl_4]^-$, $[Al_2Cl_7]^-$, $[Al_3Cl_{10}]^-$, $[Al_4Cl_{13}]^-$, etc.), chloroferrate anions (such as, e.g., $Cl_4Fe^-$), chlorostannate anions (such as, e.g., $[SnCl_3]^-$, $[Sn_2Cl_5]^-$, etc.), chloroindate anions (such as, e.g., $[InCl_6]^{3-}$, $[InCl_5]^{2-}$, $[InCl_4]^-$, etc.), and chlorozincate anions (such as, e.g., $[ZnCl_4]^{2-}$, $[Zn_2Cl_6]^{2-}$, $[Zn_3Cl_8]^{2-}$, etc.).

In some embodiments, metalate salt ILCs can be synthesized by dissolving stoichiometric amounts of metal halides in imidazolium-based ionic liquid crystals (ILCs) with a halide anion. The imidazolium-based ILCs used to synthesize the metalate salt ILCs may generally be of the form: 1-$R_1$-3-$R_2$-imidazolium, where $R_1$ is an alkyl chain with a length ranging from 8-18 carbons, and $R_2$ is a hydrogen, methyl, ethyl, propyl, butyl, substituted or unsubstituted phenyl, or other hydrocarbon group. In one example, the imidazolium-based ILCs may include 1-dodecyl-3-methylimidazolium. However, ILCs having other cation head groups may also be used to synthesize the metalate salt ILCs described herein. A wide variety of metal halides and halide anions can be combined with imidazolium-based ILCs to synthesize the metalate salt ILCs. For example, aluminum chloride ($AlCl_3$) can be dissolved in 1-docecyl-3-methylimidazolium chloride to form 1-dodecyl-3-methylimidazolium tetrachloroaluminate. The metalate salt ILCs formed in such synthesis contain an imidazolium-based cation head group covalently bound to an elongated alkyl tail group and metalate anion (e.g., tetrachloroaluminate ($AlCl_4^-$)). Other metalate salt ILCs may be formed by dissolving other metal halides in ionic liquid crystal (ILC) halide salts. For example, aluminum trifluoromethanesulfonate (AlOTf3) can be dissolved in 1-dodecyl-3-methylimidazolium trifluoromethanesulfonate to form [AlOTf4]-anions.

Similar to other ILCs, metalate salt ILCs can self-assemble into solid (crystalline phase) ordered structures at or near room temperature. The difference in polarity between the cation head groups and the alkyl tail groups promote direct self-assembly of the metalate salt ILC molecules by segregating the head and tail groups into ordered structures. In some embodiments, the head and tail groups may be segregated into layered structures (or "lamellar structures") having either a horizontal or vertical orientation. The metalate anions within the metalate salt ILCs segregate to the head group layers. Similar to other ILCs, the self-assembly of metalate salt ILCs and the pitch between the layers (i.e., the layer pitch) can be controlled by controlling the chain length of the alky tail groups, the temperatures of the deposition system and the hydrophobicity of the surface(s) upon which the metalate salt ILCs are deposited. For 1-dodecyl-3-methylimidazolium-based metalate salt ILCs, the layer pitch may be approximately 3 nm.

After self-assembly, an oxidation process (e.g., an oxygen plasma ashing, ultra-violet (UV) ozone, gas phase oxidation or solution phase oxidation process) can be used to oxidize the metalate salt ILC film and form a more robust pattern that can be transferred to the underlying substrate. The oxidation process converts the organic material within the alkyl tail group layers into volatile carbon oxides, which are removed from the substrate surface during the oxidation process. However, the metalate anions within the head group layers are converted into non-volatile metal oxides, which are left on the substrate surface after oxidation. In doing so, the oxidation process volatizes the ionic liquid crystal layer, but leaves behind a metal oxide pattern where the metalate anions were concentrated. The metal oxide pattern left on the substrate surface is more robust than the ionic liquid crystal film, and as such, can be used as a hard mask in subsequent processing steps.

Figure 4:
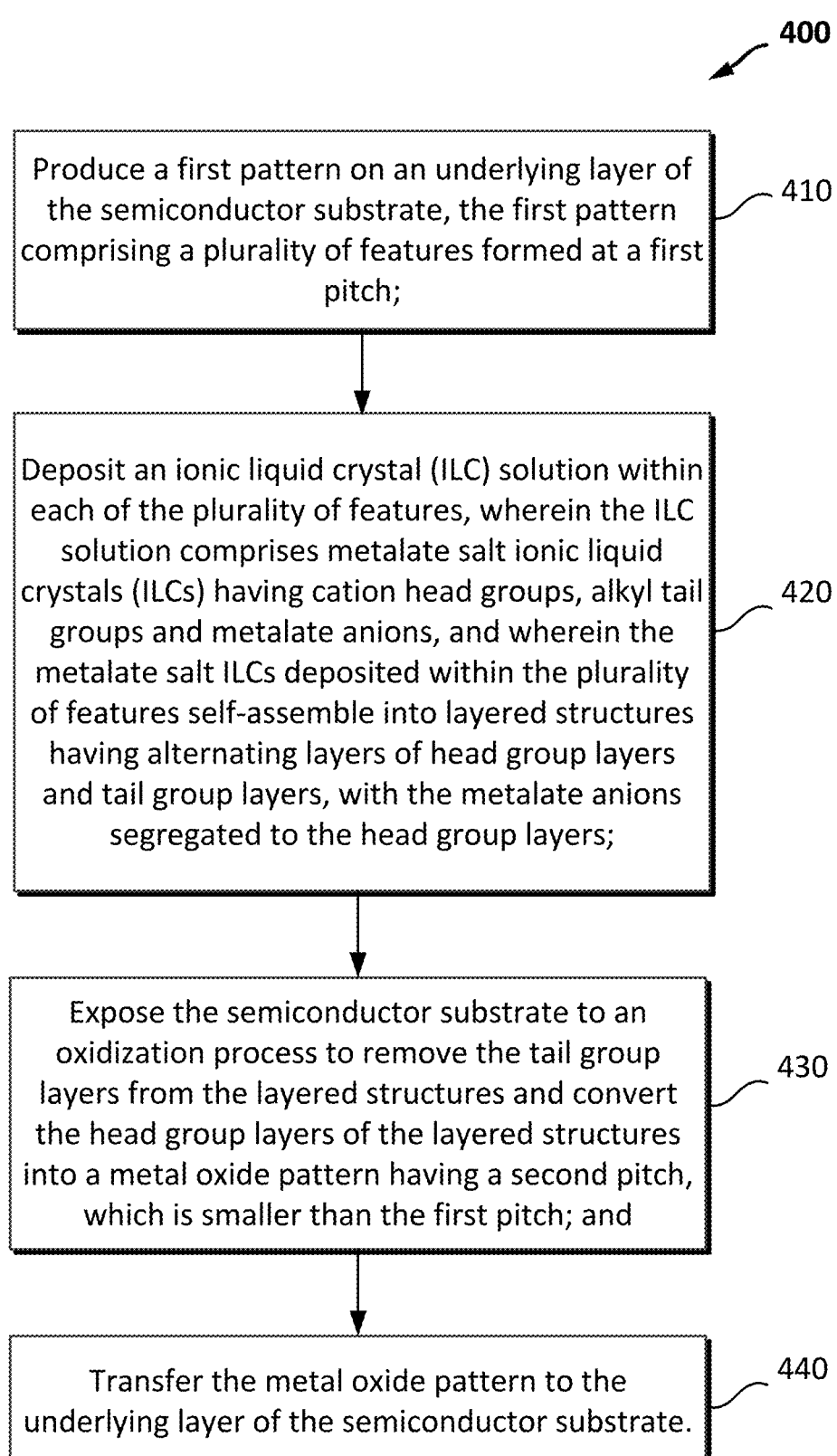
FIG. 4 is a flowchart diagram illustrating one embodiment of a method to pattern a semiconductor substrate using DSA of metalate salt ILCs followed by oxidation.

FIG. 4 illustrates one embodiment of a method 400 that uses the techniques described herein to pattern a semiconductor substrate. More specifically, the method 400 uses direct self-assembly (DSA) of metalate salt ILCs followed by oxidation of the self-assembled metalate salt ILC film to produce a metal oxide pattern that can be transferred to an underlying layer of a semiconductor substrate. It will be recognized that the embodiment of the method 400 shown in FIG. 4 is merely exemplary and additional methods may utilize the techniques described herein. Further, additional processing steps may be added to the method 400 shown in FIG. 4 as the steps described are not intended to be exclusive. Moreover, the order of the steps is not limited to the order shown in the figure as different orders may occur and/or various steps may be performed in combination or at the same time.

The method 400 shown in FIG. 4 begins by producing a first pattern on an underlying layer of the semiconductor substrate (in step 410), where the first pattern includes a plurality of features formed at a first pitch, and depositing an ionic liquid crystal (ILC) solution within each of the plurality of features (in step 420). The ILC solution deposited in step 420 includes metalate salt ionic liquid crystals (ILCs) having a cation head group, an alkyl tail group and a metalate anion. The metalate salt ILCs deposited within the features self-assemble into layered structures having alternating layers of head group layers and tail group layers, with the metalate anions segregated to the head group layers. After self-assembly, the method 400 exposes the semiconductor substrate to an oxidization process (in step 430) to remove the tail group layers from the layered structures and convert the head group layers of the layered structures into a metal oxide pattern having a second pitch, which is smaller than the first pitch. The method 400 further includes transferring the metal oxide pattern to the underlying layer of the semiconductor substrate (in step 440).

Since metalate salt ILCs self-assemble into solid (crystalline phase) ordered structures at or near room temperature, a variety of different methods may be used to deposit the ILC solution within the features (in step 420). In some embodiments, the ILC solution containing the metalate salt ILCs may be dispensed at a temperature above the melting point of the ILCs. After depositing the ILC solution within the features (in step 420), the substrate may be cooled to promote self-assembly of the metalate salt ILCs and solidify the ILC film. In other embodiments, an ILC solution containing a dilute solution of metal salt ILCs in a solvent may be dispensed at or near room temperature and deposited within the features (in step 420). After deposition, the solvent may evaporate, leaving only the ILC film within the features. In some cases, the evaporative method may be preferred, due to its ability to produce very thin ILC films. Some ILCs are known to be sensitive to air and/or water. In order to accommodate such ILCs, the ILC solution may be dispensed a controlled atmosphere, oxygen and water free environment, in some embodiments.

The semiconductor substrate may be exposed to a wide variety of oxidation processes in step 430. For example, the semiconductor substrate may be exposed to an oxygen plasma ashing process, an ultra-violet (UV) ozone process, a gas phase oxidation process or a solution phase oxidation process. Regardless of the oxidation process used, the layered structures formed within the plurality of features are oxidized to: (a) convert the tail group layers into volatile carbon oxides, which are removed from the layered structures during the oxidation process, and (b) convert the metalate anions within the head group layers into non-volatile metal oxides, which remain on the substrate after the oxidation process. The non-volatile metal oxides created via oxidation of the metalate anions form the metal oxide pattern, which is transferred to the underlying layer of the semiconductor substrate (in step 440).

As noted above, the metalate salt ILCs include a cation head group, an alkyl tail group and a metalate anion. In some embodiments, the metalate salt ILCs may include an imidazolium, pyrazolium, pyrrolidinium, pyridinium, piperidinium, morpholinium, ammonium, phosphonium, sulphonium or cholinium based cation head group, and a metalate anion selected from chloroaluminate anions, chloroferrate anions, chlorostannate anions, chloroindate anions and chlorozincate anions. In one example embodiment, the metalate salt ILCs included within the ILC solution may be 1-dodecyl-3-methylimidazolium tetrachloroaluminate. In another example embodiment, the metalate salt ILCs included within the ILC solution may be 1-dodecyl-3-methylimidazolium tetrachloroferrate. Other metalate salt ILCs not specifically mentioned herein may also be used.

In some embodiments, the metalate salt ILCs deposited within the plurality of features (in step 420) may self-assemble into vertically layered structures. A wide variety of methods may be used to form vertically layered structures of self-assembled metalate salt ILCs. For example, co-pending U.S. patent application Ser. No. 18/388,240 describes one method of forming vertically layered ILC structures on a periodic substrate surface by exposing an upper surface of an ILC solution containing ILCs to a gas phase, non-polar solvent. A similar method may be used herein to form vertically layered structures of self-assembled metalate salt ILCs on a periodic substrate surface. However, vertically layered structures may also be formed by depositing the metalate salt ILCs within features (e.g., trenches, holes, etc.) having neutral bottom surfaces and hydrophilic sidewall surfaces, as shown in the examples provided in FIG. 2(c) and FIG. 5. When deposited within such features, metalate salt ILCs may self-assemble into vertically layered structures having alternating layers of head group layers and tail group layers, with the head group layers oriented towards the hydrophilic sidewall surfaces of the features. Because the hydrophilic sidewall surfaces function as guiding surfaces for the molecular self-assembly (by attracting the polar molecules of the metalate salt ILCs), the metalate salt ILCs may self-assemble within the features with or without the use of a non-polar solvent.

In some embodiments, the method 400 may produce the first pattern (in step 410) by: (a) depositing a neutral layer on the underlying layer of the semiconductor substrate, (b) depositing a hydrophilic layer on the neutral layer, and (c) using a photolithography process to produce the first pattern within the hydrophilic layer, such that the neutral layer is exposed at a bottom of each feature and the hydrophilic layer is exposed on sidewall surfaces of each feature. In some embodiments, the photolithography process may form a plurality of trenches within the hydrophilic layer to form a pattern of hydrophilic lines on the neutral layer, and the ILC solution may be deposited within the trenches interspersed between each line (in step 420). In other embodiments, the photolithography process may form a pattern of holes that extend through the hydrophilic layer to the neutral layer, and the ILC solution may be deposited within the holes formed within the hydrophilic layer (in step 420).

A wide variety of photolithography processes can be used to produce the first pattern in step 410. For example, UV (365 nm), deep-UV (248 and 193 nm) and extreme-UV (EUV, 13.5 nm) photolithography processes can be used. In one example embodiment, a photolithography process comprising EUV photoresist coating, exposure, bake and develop steps is used to form the first pattern within the hydrophilic layer (in step 410). When the hydrophilic layer is patterned using EUV lithography, the first pitch between the plurality of features may be at a minimum approximately 28 nm.

The metalate salt ILCs deposited within the plurality of features (in step 420) self-assemble into vertically layered structures having alternating layers of head group layers and tail group layers. As shown in FIG. 2(c) and noted above, the layer pitch ($\rho$) between the alternating layers of the vertically layered structures is equivalent to the combined width of the head and tail groups of the self-assembled ILCs and is generally dependent on the chain length of the alkyl tail groups. In some embodiments, the layer pitch ($\rho$) between the vertically layered structures may be approximately 3 nm when 1-dodecyl-3-methylimidazolium-based metalate salt ILCs (which have 12 hydrocarbon molecules) are used within the ILC solution.

In some embodiments, the method 400 controls the layer pitch (ρ) between the alternating layers of the vertically layered structures by controlling the chain length of the alkyl tail groups. For example, the chain length of the alkyl tail groups may range between 8-18 hydrocarbon molecules, depending on the metalate salt ILCs used within the ILC solution. In some embodiments, the method 400 may utilize a metalate salt ILC with a longer alkyl chain length to increase the layer pitch, or a metalate salt ILC with a smaller alkyl chain length to decrease the layer pitch. By selecting a metalate salt ILC that self-assembles into an ordered structure with a smaller pitch (e.g., about 3 nm) than the first pitch between the plurality of features (e.g., a minimum of about 28 nm) and oxidizing the ordered structure to produce a robust metal oxide pattern, the method 400 shown in FIG. 4 can be used to provide pitch multiplication for advanced patterning techniques.

Figure 5:
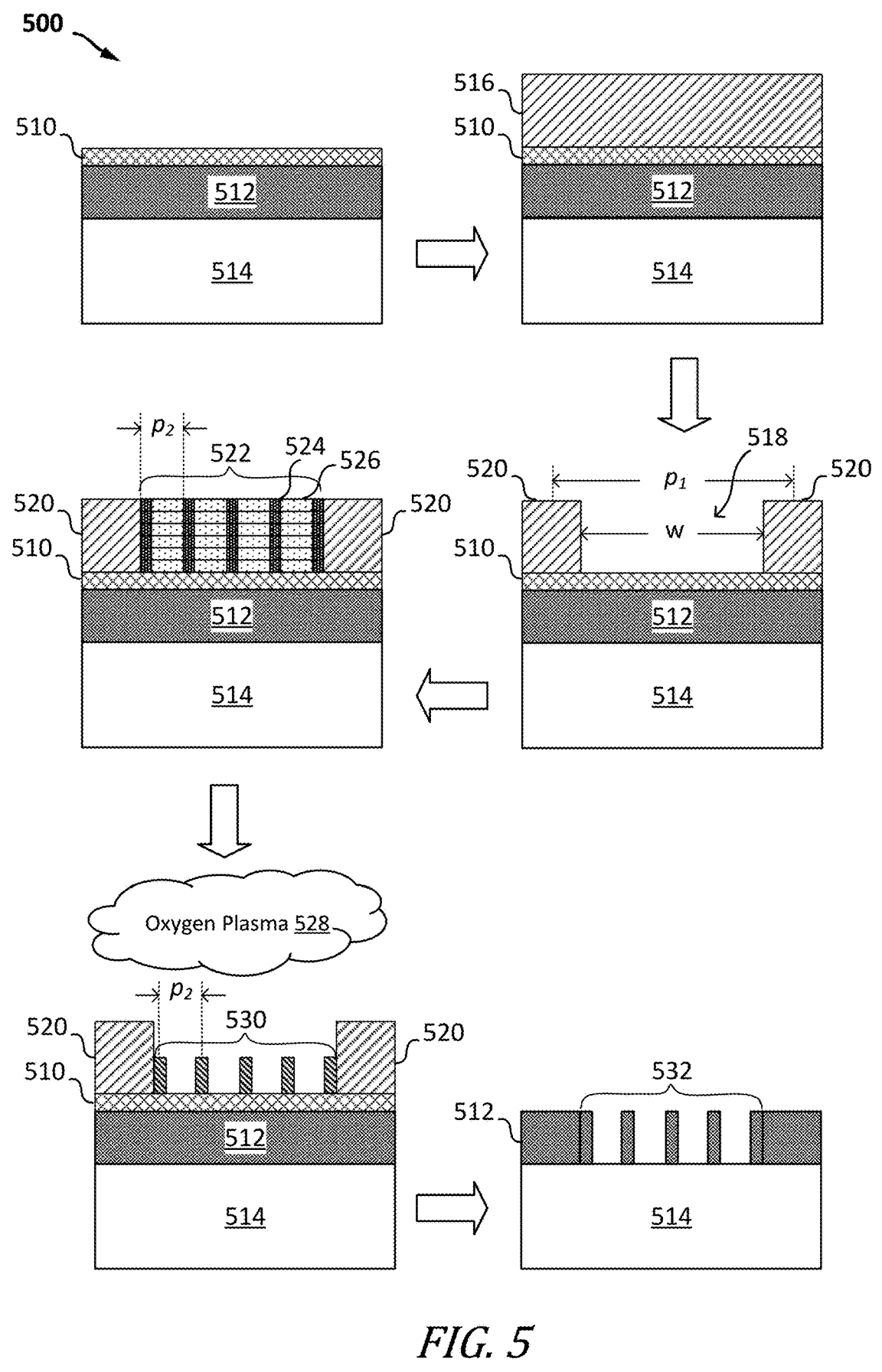

FIG. 5 illustrates an example process flow 500 that uses the method 400 shown in FIG. 4 to pattern a semiconductor substrate using metalate salt ILCs. As shown in FIG. 5, the process flow 500 begins by depositing a neutral layer 510 on an underlying layer 512 provided on a surface of a semiconductor substrate 514. The neutral layer 510 comprises a material, which has equal affinity for both the cation head group and alkyl tail group of the metalate salt ILCs. In one example, the neutral layer 510 may comprise polytetrafluoroethylene (PTFE). Alternatively, the neutral layer 510 may comprise other PTFE-like polymers, polymers deposited on surfaces exposed to a fluorocarbon or hydrofluorocarbon plasma, graphene and other film layers having functional groups tuned to provide a neutral surface. After depositing the neutral layer 510, a hydrophilic layer 516 is deposited on the neutral layer 510. The hydrophilic layer 516 may include a wide variety of materials having a water contact angle less than or equal to 60°. For example, the hydrophilic layer 516 may comprise amorphous carbon (a-C), silicon oxycarbide (SiOC), silicon carbide (SiC), amorphous silicon or silicon dioxide ($SiO_2$). In one example, hydroxyl terminated $SiO_2$ is used to form the hydrophilic layer 516.

A wide variety of deposition processes can be used to deposit the neutral layer 510 and the hydrophilic layer 516. For example, the neutral layer 510 and the hydrophilic layer 516 may be deposited using one or more deposition techniques including, but not limited to, spin-on deposition, chemical vapor deposition (CVD), plasma enhanced CVD (PECVD), physical vapor deposition (PVD), atomic layer deposition (ALD), and/or other deposition processes.

After the hydrophilic layer 516 is deposited on the neutral layer 510, a photolithography process is used to form a first pattern within the hydrophilic layer 516. For example, a photolithography process comprising resist coating, exposure, bake and develop/etch steps may be used to form a plurality of trenches 518 within the hydrophilic layer 516, thereby forming a first pattern of hydrophilic lines 520 on the neutral layer 510 at a first pitch ($\rho_1$). In some embodiments, the first pitch ($\rho_1$) may be greater than approximately 28 nm when EUV lithography is used to form the first pattern.

As shown in FIG. 5, the trenches 518 formed within the hydrophilic layer 516 have a neutral bottom surface and hydrophilic sidewall surfaces. In order to enable vertically aligned layering of the metalate salt ILCs in the next process step, the width (w) of the trenches 518 is specifically chosen to be an integer multiple of a layer pitch ($\rho_2$) between the alternating layers of the vertically layered structures 522 subsequently formed within the trenches 518.

After forming the first pattern, the process flow 500 deposits an ionic liquid crystal (ILC) solution comprising metalate salt ILCs on the substrate surface. In some embodiments, spin coating may be used to deposit the ILC solution. Thin layers of metalate salt ILCs can be achieved by dissolving the metalate salt ILCs in an appropriate solvent and dispensing the ILC solution over the substrate surface. The choice of solvent depends on the metalate salt ILCs included within the solution. For 1-dodecyl-3-methylimidazolium pentachloroindate, for example, the solvent can include alcohols (such as, e.g., methanol, isopropyl alcohol (IPA), etc.), ethers, acetates (such as, e.g., ethyl acetate, acetone, etc.), water, hexane, toluene, acetonitrile and other organic solvents. The final thickness of the ILC film can be controlled by adjusting the wet film thickness during spin coating and the concentration of the metalate salt ILCs in solution. By using dilute solutions of metalate salt ILCs, very thin ILC films can be achieved once the solvent has evaporated. Ideally, the trenches 518 formed during the photolithography process are filled with the ILC solution, while the tops of the hydrophilic lines 520 are free of ILCs.

As shown in FIG. 5, the metalate salt ILCs deposited within the trenches 518 self-assemble into vertically layered structures 522 having alternating layers of head group layers 524 and tail group layers 526, with the head group layers 524 oriented towards the hydrophilic sidewall surfaces of the trenches 518. In some embodiments, an annealing step may be performed to assist in the formation of the vertically layered structures 522. As further shown in FIG. 5, the layer pitch ($\rho_2$) between the alternating layers of the vertically layered structures 522 is: (a) equivalent to the combined width of the head and tail group layers, and (b) an integer divisor (e.g., 4) of the width (w) of the trenches 518. This spacing enables the head and tail group layers of the metalate salt ILCs to vertically align within the trenches 518.

After self-assembly of the vertically layered structures 522, the semiconductor substrate can be transferred to a plasma tool for ashing with an oxygen ($O_2$) plasma. As shown in FIG. 5, exposing of the vertically layered structures 522 to an oxygen plasma 528 removes the organic components and non-metals of the metalate salt ILCs (e.g., by converting the alkyl tail group layers into volatile carbon oxides), while converting the metalate anions in the vertically layered structures 522 to metal oxides. This results in a metal oxide pattern 530 having a second pitch ($\rho_2$), which is identical to the layer pitch ($\rho_2$) between the alternating layers of the vertically layered structures 522. The metal oxide pattern 530 can then be used as a hard mask in subsequent processing steps to transfer the metal oxide pattern 530 to the underlying layer 512, thus forming a pattern 532 in the underlying layer 512.

The method 400 shown in FIG. 4 and the process flow 500 shown in FIG. 5 combine traditional photolithography with direct self-assembly (DSA) of metalate salt ILCs and oxidation to provide pitch multiplication for advanced patterning techniques. As noted above and shown in FIG. 5, the width (w) of the features (e.g., trenches, holes, etc.) formed within the first pattern is equal to an integer multiple of the layer pitch ($\rho_2$, e.g., 3 nm) between the alternating layers of the vertically layered structures 522. When the vertically layered structures 522 are subsequently oxidized, the tail group layers 526 are removed from the vertically layered structures 522 and the head group layers 524 are converted into a metal oxide pattern 530 having a second pitch ($\rho_2$), which is identical to the layer pitch ($\rho_2$) between the alternating layers of the vertically layered structures 522. By utilizing DSA of metalate salt ILCs and oxidizing the metal salt ILCs after self-assembly, the pattern transfer method and process shown in FIGS. 4 and 5 enable advanced patterning at 3 nm pitch, a feat which is not currently possible with DSA of block copolymers or typical ionic liquid crystals.

Figure 6:
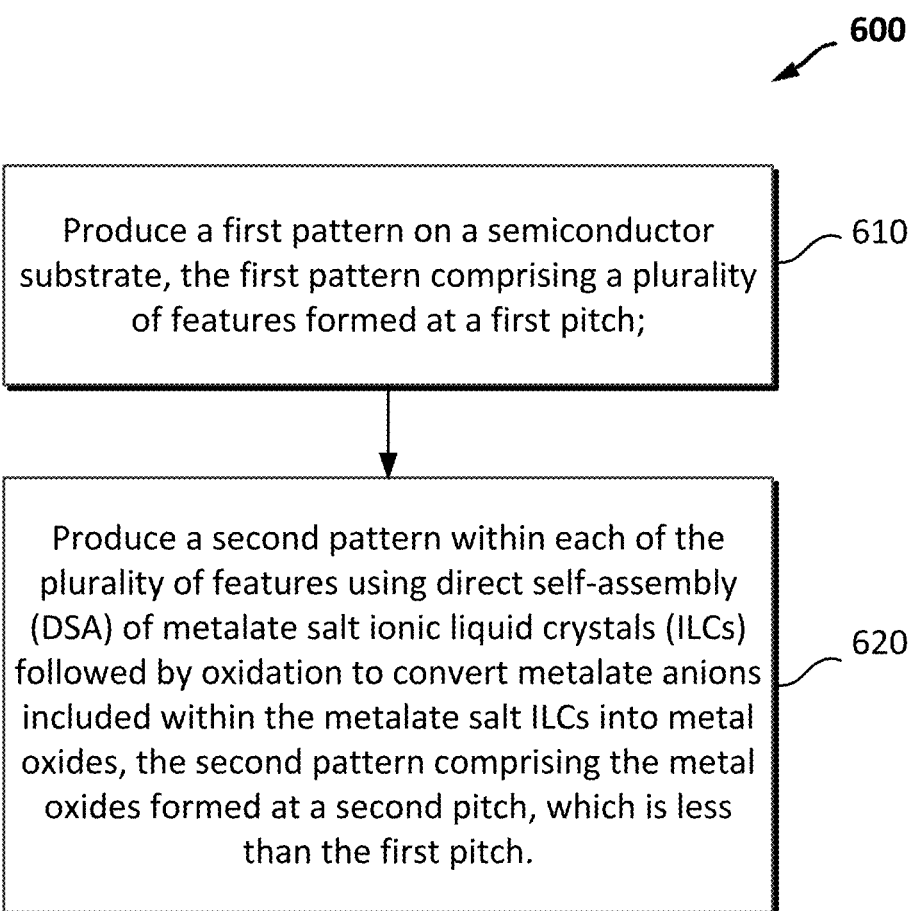
FIG. 6 is a flowchart diagram illustrating one embodiment of a pitch multiplication method that uses DSA of metalate salt ILCs followed by oxidation.

FIG. 6 illustrates one embodiment of a method 600 that uses the techniques described herein to provide pitch multiplication in a pattern transfer process. More specifically, the pitch multiplication method 600 uses direct self-assembly (DSA) of metalate salt ILCs followed by oxidation of the self-assembled metalate salt ILC film to produce a metal oxide pattern that can be transferred to an underlying layer of a semiconductor substrate. It will be recognized that the embodiment of the method 600 shown in FIG. 6 is merely exemplary and additional methods may utilize the techniques described herein. Further, additional processing steps may be added to the method 600 shown in FIG. 6 as the steps described are not intended to be exclusive. Moreover, the order of the steps is not limited to the order shown in the figure as different orders may occur and/or various steps may be performed in combination or at the same time.

The method 600 shown in FIG. 6 begins by producing a first pattern on a semiconductor substrate (in step 610), and producing a second pattern within each of the plurality of features using direct self-assembly (DSA) of metalate salt ionic liquid crystals (ILCs) followed by oxidation to convert metalate anions included within the metalate salt ILCs into metal oxides (in step 620). The first pattern produced in step 610 includes a plurality of features formed at a first pitch ($\rho_1$). The second pattern produced in step 620 includes the metal oxides formed at a second pitch ($\rho_2$), which is less than the first pitch ($\rho_1$).

In some embodiments, the method 600 may produce the second pattern (in step 620) by: (a) depositing an ionic liquid crystal (ILC) solution comprising the metalate salt ILCs within each of the plurality of features, and (b) exposing the semiconductor substrate to an oxidization process after the metalate salt ILCs self-assemble into ordered structures. As noted above, the metalate salt ILCs comprise cation head groups, alkyl tail groups and the metalate anions. When the metalate salt ILCs are deposited within the plurality of features, the metalate salt ILCs self-assemble into vertically layered structures having alternating layers of head group layers and tail group layers, with the metalate anions segregated to the head group layers.

In some embodiments, the method 600 may produce the first pattern (in step 610) by: (a) depositing a neutral layer on the semiconductor substrate, (b) depositing a hydrophilic layer on the neutral layer, and (c) using a photolithography process to produce the first pattern within the hydrophilic layer, such that the neutral layer is exposed at a bottom of each feature and the hydrophilic layer is exposed on sidewall surfaces of each feature. When the metalate salt ILCs are deposited within the plurality of features (in step 620), the metalate salt ILCs may self-assemble into vertically layered structures having alternating layers of head group layers and tail group layers, with the head group layers oriented towards the sidewall surfaces of the features.

Exposing the semiconductor substrate to the oxidization process removes the tail group layers from the vertically layered structures and converts the metalate anions into the metal oxides. A wide variety of oxidation processes can be used in method 600. For example, the semiconductor substrate may be exposed to an oxygen plasma ashing process, an ultra-violet (UV) ozone process, a gas phase oxidation process or a solution phase oxidation process. Regardless of the oxidation process used, the vertically layered structures formed within the plurality of features are oxidized to: (a)

convert the tail group layers into volatile carbon oxides, which are removed from the vertically layered structures during the oxidation process, and (b) convert the metalate anions within the head group layers into non-volatile metal oxides, which remain on the substrate after the oxidation process.

In some embodiments, the method 600 may further include controlling a layer pitch between the alternating layers of the vertically layered structures by controlling a chain length of the alkyl tail groups included within the metalate salt ILCs. In some embodiments, a width of each feature may be equivalent to an integer multiple of the layer pitch between the alternating layers of the vertically layered structures, and the second pitch ($\rho_2$) may be equivalent to the layer pitch.

The present disclosure provides various embodiments of improved process flows and methods to pattern a semiconductor substrate using metalate salt ionic liquid crystals (ILCs). The disclosed embodiments improve upon conventional process flows and pattern transfer methods by utilizing a new class of ionic liquid crystal (ILC) molecules for direct self-assembly. In particular, the disclosed embodiments use metalate salt ILCs having metalate anions. The metalate salt ILCs allow pattern transfer after self-assembly of the metalate salt ILCs and oxidation of the ordered structures to remove the organic components and convert the metalate anions into metal oxide patterns. In addition to providing a robust metal oxide pattern, which can be transferred to the underlying substrate, the process flows and methods disclosed herein enable ILCs to be used as pitch multipliers in advanced patterning techniques. By utilizing the techniques described above, the process flows and methods disclosed herein can be used to form metal oxide patterns at sub-5 nm pitch (e.g., approximately 3 nm), which is a much tighter pitch than what is currently possible with EUV lithography or block copolymer DSA.

The term "semiconductor substrate" or "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may also include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the methods described herein will be apparent to those skilled in the art in view of this description. It will be recognized, therefore, that the described methods are not limited by these example arrangements. It is to be understood that the forms of the methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method to pattern a semiconductor substrate, the method comprising:

producing a first pattern on an underlying layer of the semiconductor substrate, the first pattern comprising a plurality of features formed at a first pitch;

depositing an ionic liquid crystal (ILC) solution within each feature of the plurality of features, wherein the ILC solution comprises metalate salt ionic liquid crystals (ILCs) having cation head groups, alkyl tail groups, and metalate anions, and wherein the metalate salt ILCs deposited within the plurality of features self- assemble into layered structures having alternating layers of head group layers and tail group layers, with the metalate anions segregated to the head group layers;

exposing the semiconductor substrate to an oxidization process to remove the tail group layers from the layered structures and convert the head group layers of the layered structures into a metal oxide pattern having a second pitch, which is smaller than the first pitch; and transferring the metal oxide pattern to the underlying layer of the semiconductor substrate.

2. The method of claim 1, wherein said exposing the semiconductor substrate to the oxidization process comprises exposing the semiconductor substrate to an oxygen plasma ashing process, an ultra-violet (UV) ozone process, a gas phase oxidation process, or a solution phase oxidation process.

3. The method of claim 1, wherein said exposing the semiconductor substrate to the oxidization process oxidizes the layered structures to:

convert the tail group layers into volatile carbon oxides, which are removed from the layered structures during the oxidation process; and convert the metalate anions within the head group layers into non-volatile metal oxides, which remain after the oxidation process as the metal oxide pattern.

4. The method of claim 1, wherein the cation head groups within the metalate salt ILCs comprise an imidazolium, pyrazolium, pyrrolidinium, pyridinium, piperidinium, morpholinium, ammonium, phosphonium, sulphonium, or cholinium based cation head group.

5. The method of claim 1, wherein metalate salt ILCs comprise an imidazolium-based cation head group of the form: $1\text{-}R_1\text{-}3\text{-}R_2$-imidazolium, where $R_1$ is an alkyl chain with a chain length ranging from 8-18 carbons, and $R_2$ is a hydrogen, a methyl group, an ethyl group, a propyl group, a butyl group, or a substituted or unsubstituted phenyl group.

6. The method of claim 5, wherein the metalate anions within the metalate salt ILCs comprise chloroaluminate anions, chloroferrate anions, chlorostannate anions, chloroindate anions, or chlorozincate anions.

7. The method of claim 1, wherein the metalate salt ILCs comprise 1-dodecyl-3-methylimidazolium tetrachloroaluminate or 1-dodecyl-3-methylimidazolium tetrachloroferrate.

8. The method of claim 1, wherein said producing the first pattern comprises:

depositing a neutral layer on the underlying layer of the semiconductor substrate;

depositing a hydrophilic layer on the neutral layer; and using a photolithography process to produce the first pattern within the hydrophilic layer, such that the neutral layer is exposed at a bottom of each feature and the hydrophilic layer is exposed on sidewall surfaces of each feature.

9. The method of claim 8, wherein the metalate salt ILCs deposited within the plurality of features self-assemble into vertically layered structures having alternating layers of head group layers and tail group layers, wherein the head group layers of the vertically layered structures are oriented towards the sidewall surfaces of the features.

10. The method of claim 9, further comprising controlling a layer pitch between the alternating layers of the vertically layered structures by controlling a chain length of the alkyl tail groups.

11. The method of claim 9, wherein a width of each feature is equivalent to an integer multiple of a layer pitch between the alternating layers of the vertically layered structures, and wherein the second pitch is equivalent to the layer pitch.

12. The method of claim 9, wherein said using the photolithography process to produce the first pattern comprises:

using the photolithography process to form a plurality of trenches within the hydrophilic layer to form a pattern of hydrophilic lines on the neutral layer; and wherein the ILC solution is deposited within each trench of the plurality of trenches.

13. The method of claim 9, wherein said using the photolithography process to produce the first pattern comprises:

using the photolithography process to form a pattern of holes that extend through the hydrophilic layer to the neutral layer; and wherein the ILC solution is deposited within each of the holes.

14. A pitch multiplication method comprising:

producing a first pattern on a semiconductor substrate, the first pattern comprising a plurality of features formed at a first pitch; and producing a second pattern within each feature of the plurality of features using direct self-assembly (DSA) of metalate salt ionic liquid crystals (ILCs) followed by oxidation to convert metalate anions included within the metalate salt ILCs into metal oxides, the second pattern comprising the metal oxides formed at a second pitch, which is less than the first pitch.

15. The pitch multiplication method of claim 14, wherein said producing the second pattern comprises:

depositing an ionic liquid crystal (ILC) solution comprising the metalate salt ILCs within each feature of the plurality of features, wherein the metalate salt ILCs comprise cation head groups, alkyl tail groups, and the metalate anions, and wherein the metalate salt ILCs deposited within the plurality of features self-assemble into layered structures having alternating layers of head group layers and tail group layers, with the metalate anions segregated to the head group layers; and exposing the semiconductor substrate to an oxidation process to remove the tail group layers from the layered structures and convert the metalate anions into the metal oxides.

16. The pitch multiplication method of claim 15, wherein said exposing the semiconductor substrate to the oxidization process comprises exposing the semiconductor substrate to an oxygen plasma ashing process, an ultra-violet (UV) ozone process, a gas phase oxidation process, or a solution phase oxidation process.

17. The pitch multiplication method of claim 15, wherein said exposing the semiconductor substrate to the oxidization process oxidizes the layered structures to:

convert the tail group layers into volatile carbon oxides, which are removed from the layered structures during the oxidation process; and convert the metalate anions within the head group layers into non-volatile metal oxides, which remain after the oxidation process as the metal oxides.

18. The pitch multiplication method of claim 15, wherein said producing the first pattern comprises:

depositing a neutral layer on the semiconductor substrate;

depositing a hydrophilic layer on the neutral layer; and using a photolithography process to produce the first pattern within the hydrophilic layer, such that the neutral layer is exposed at a bottom of each feature and the hydrophilic layer is exposed on sidewall surfaces of each feature.

19. The pitch multiplication method of claim 18, wherein the metalate salt ILCs deposited within the plurality of features self-assemble into vertically layered structures having alternating layers of head group layers and tail group layers, wherein the head group layers of the vertically layered structures are oriented towards the sidewall surfaces of the features.

20. The pitch multiplication method of claim 19, further comprising controlling a layer pitch between the alternating layers of the vertically layered structures by controlling a chain length of the alkyl tail groups.

21. The pitch multiplication method of claim 19, wherein a width of each feature is equivalent to an integer multiple of a layer pitch between the alternating layers of the vertically layered structures, and wherein the second pitch is equivalent to the layer pitch.

*    *    *    *    *